United States Patent
Tago

[11] Patent Number: 5,914,415
[45] Date of Patent: Jun. 22, 1999

[54] VENT FILTER MEMBER

[75] Inventor: Takashi Tago, Osaka, Japan

[73] Assignee: Nitto Denko Corporation, Osaka, Japan

[21] Appl. No.: 08/908,959

[22] Filed: Aug. 8, 1997

[30] Foreign Application Priority Data

Sep. 18, 1996  [JP]  Japan ................... 8-269445

[51] Int. Cl.[6] .................................. B01D 19/00
[52] U.S. Cl. ............... 55/385.4; 55/385.1; 55/524; 55/527; 55/DIG. 30; 96/13; 96/14
[58] Field of Search ............... 55/385.1, 385.4, 55/385.6, 524, 527, 529, DIG. 30, DIG. 31; 96/13, 14; 123/198 E

[56] References Cited

U.S. PATENT DOCUMENTS

| | | | |
|---|---|---|---|
| 3,854,907 | 12/1974 | Rising | 55/421 |
| 4,102,785 | 7/1978 | Head et al. | 55/487 |
| 4,215,665 | 8/1980 | Stambaugh | 55/385.3 |
| 4,722,366 | 2/1988 | Maaskamp . | |
| 4,757,654 | 7/1988 | Korhonen et al. . | |
| 4,772,657 | 9/1988 | Akiyama et al. . | |
| 5,125,428 | 6/1992 | Rauter . | |
| 5,242,747 | 9/1993 | Wu | 55/527 |
| 5,342,434 | 8/1994 | Wu | 55/524 |
| 5,353,949 | 10/1994 | Seibert et al. | 55/385.1 |
| 5,417,743 | 5/1995 | Dauber | 55/385.6 |
| 5,462,586 | 10/1995 | Sugiyama et al. | 96/13 |
| 5,522,769 | 6/1996 | DeGuiseppi . | |

*Primary Examiner*—Jay H. Woo
*Assistant Examiner*—Minh-Chan T. Pham
*Attorney, Agent, or Firm*—Sughrue, Mion, Zinn Macpeak & Seas, PLLC

[57] ABSTRACT

Disclosed are a first vent filter member which includes: an elastomer member made of a thermoplastic elastomer to which a water-repellent film can be fixed by fusion and having a cylindrical form whose one end part serves as an opening for insertion of a mounting part of a base; a water-repellent film thermally fusion-bonded to the other end part of the elastomer member; and a covering cap which protects the water-repellent film and has been fitted and fixed to the elastomer member in such a manner that a vent passageway is formed between the elastomer member and the covering cap, and a second vent filter member which includes: an elastomer member made of a thermoplastic elastomer to which a water-repellent film can be fixed by fusion and having a disk form which has on one side thereof a tapered insertional part to be inserted into a mounting part, is blocked on the other side with a mist barrier cover, and has a sealing/fixing part on the outer periphery thereof and a vent passageway extending from said one side to the outer periphery of said other side; and a water-repellent film fixed by fusion to the elastomer member somewhere in the vent passageway so as to block the vent passageway therewith. These vent filter members can be easily mounted, are less apt to suffer a decrease in breathing function caused by watertightness and water-repellent-film fouling, and are highly reliable.

6 Claims, 4 Drawing Sheets

VENT FILTER MEMBER

FIELD OF THE INVENTION

The present invention relates to a vent filter member employing a filter medium having dustproof properties, waterproofness, and air permeability. More particularly, this invention relates to an easily mountable vent filter member which is highly reliable and inexpensive and is used for, e.g., regulating the inner air pressure of the housing of an apparatus or instrument used indoors around a place where water is supplied or handled or the housing of an outdoor apparatus or instrument, in particular, an automotive electrical apparatus or instrument, a portable communication apparatus, or the like.

BACKGROUND OF THE INVENTION

Vent filter members employing a water-repellent film are used in automotive electrical apparatuses and instruments, such as headlights, taillights, and fog lamps, motors, various pressure sensors, and pressure switches.

The filter members are also used in portable telephones, cameras, electric razors, and electric-powered toothbrushes.

These vent filter members are used for alleviating the variation of pressure in apparatuses which is caused by variation of temperature, for transmitting a voice or sound, or for releasing a gas generated inside, while preventing water and dust particles from coming into the apparatuses.

A prior art technique for attaching a water-repellent film to an apparatus is illustrated in FIG. 3. In this technique, a double-faced pressure-sensitive adhesive tape 1 is punched to form a hole of a given shape to thereby ensure the area of a vent hole 2. Thereafter, a water-repellent film 3 is bonded to the double-faced pressure-sensitive adhesive tape 1, and then punched to obtain a structure which is larger than the vent hole 2 and thereby has an application part. The resultant structure is fixed to an adhered through the application part of the double-faced pressure-sensitive adhesive tape 1 to simultaneously conduct sealing. This technique has been frequently used because of its inexpensiveness and the easiness of production.

However, there is a fear that the water-repellent film used in an automotive electrical apparatus or instrument or the like may suffer clogging as a result of wind and rain or of the adhesion of mud or an oil mist to thereby have reduced air permeability or reduced waterproofness. For avoiding the clogging, it has been necessary to prevent the water-repellent film from being directly exposed to a mist by fitting an L-shaped tube 5 to the mounting part of a base 4 as shown in FIG. 4 or by attaching a water-repellent film at the bottom of a labyrinth structure.

There also are mounting techniques for use in applications in which the pressure-sensitive adhesive may deteriorate by the action of heat or chemicals and finally peel off. In the case where a water-repellent film is to be attached to a base housing which is a thermoplastic resin molding, the film is fixed by thermal fusion. In the case where a water-repellent film is to be attached to a base 4 which is a metal such as an aluminum die cast, the water-repellent film 3 is fixed by caulking using a combination of a rubber packing 6 and a washer 7, as shown in FIG. 5.

As described above, in applications in which protection of a water-repellent film is necessary or a metallic base such as an aluminum die cast is used, there is a problem that additional parts and special jigs are necessary and highly precise temperature control is required. There is hence a desire for a vent filter member which can be easily mounted and fixed and is highly reliable.

SUMMARY OF THE INVENTION

An object of the present invention is to provide a vent filter member which can be easily mounted, is less apt to suffer a decrease in breathing function which is caused by watertightness or by the fouling of a water-repellent film, and has satisfactory breathing sensitivity.

The above object is accomplished with a vent filter member according to a first embodiment, which comprises: an elastomer member made of a thermoplastic elastomer to which a water-repellent film can be fixed by fusion and having a cylindrical form whose one end part serves as an opening for insertion of a mounting part (i.e., a projecting part of a base); a water-repellent film thermally fusion-bonded to the other end part of the elastomer member; and a covering cap which protects the water-repellent film and has been fitted and fixed to the elastomer member in such a manner that a vent passageway is formed between the elastomer member and the covering cap.

The above object is also accomplished with a vent filter member according to a second embodiment, which comprises: an elastomer member made of a thermoplastic elastomer to which a water-repellent film can be fixed by fusion and having a disk form which has on one side thereof a tapered insertional part to be inserted into a mounting part, is blocked on the other side with a mist barrier cover, and has a sealing/fixing part on the outer periphery thereof and a vent passageway extending from said one side to the outer periphery of said other side; and a water-repellent film fixed by fusion to the elastomer member somewhere in the vent passageway so as to block the vent passageway therewith.

BRIEF DESCRIPTION OF THE DRAWINGS

FIG. 1 (B) is a plan view of the same.

FIG. 2 (B) is a plan view of the same; and FIG. 2 (C) is a vertical sectional front view illustrating the same mounted on a base.

FIG. 3 (B) is a plan view of the same.

Numerals in the above figures indicate as follows: 1; double-faced pressure-sensitive adhesive tape, 2; vent hole 3; water-repellent film, 4; base, 5; L-shaped tube, 6; rubber packing, 7; washer, 11; water-repellent film, 12; opening for insertion of the projecting part of a base, 13; vent passageway, 14; elastomer member, 15; recessed groove, 16; covering cap, 17; fixing pin, 18; pin hole, 19; fixing part, 20; vent passageway, 21; base, 22; mounting part, 23; insertional part, 24; mist barrier cover, 25; elastomer member, 26; sealing/fixing part, and 27; vent passageway.

DETAILED DESCRIPTION OF THE INVENTION

Embodiments of the present invention will be explained below by reference to FIGS. 1 and 2.

Figure 1A:
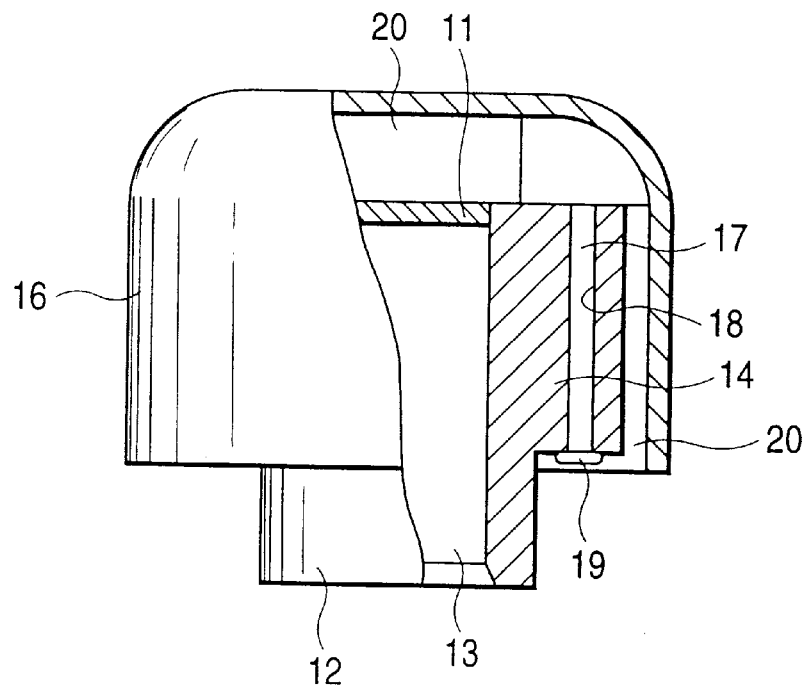
FIG. 1 (A) is a partially cutaway front view illustrating a first embodiment of the vent filter member according to the present invention.
Figure 1B:
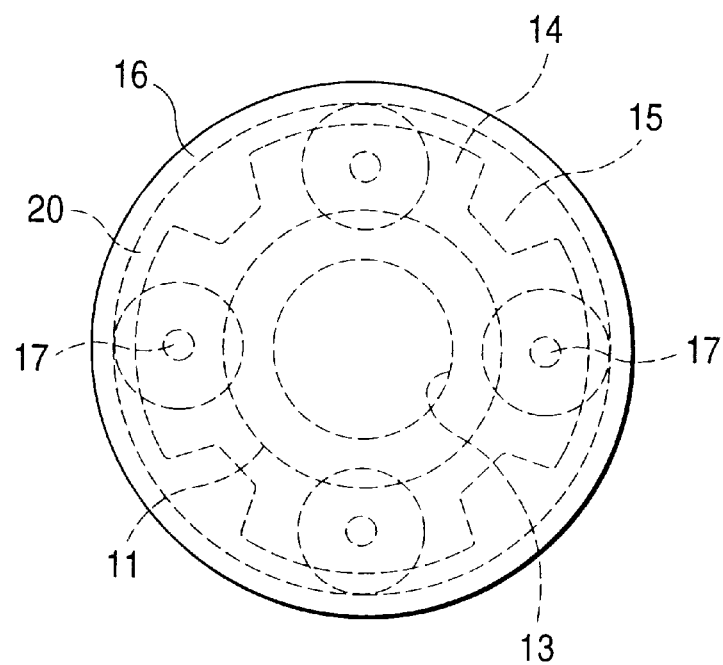

The first embodiment, which is illustrated in FIG. 1, is a vent filter member to be applied to a base in which the mounting part is projecting like a chimney. This vent filter member comprises a water-repellent film 11 and an elastomer member 14, which is made of a thermoplastic elastomer having rubber elasticity to which the water-repellent film 11 can be fixed by fusion. The elastomer member 14 has a cylindrical form, one end part of which serves as an opening 12 for insertion of a mounting part, and the other end part of which is open to form a vent passageway 13 inside. The water-repellent film 11 has been thermally fusion-bonded to the other end part of the elastomer member 14. The elastomer member 14 has, on its outer periphery, recessed grooves 15 extending in the direction of the axis and disposed at a regular interval with respect to the circumferential direction.

The water-repellent film 11 is protected with a covering cap 16 made of a hard synthetic resin. This covering cap 16 has such a shape that said other end part and the outer periphery of the elastomer member 14 are covered therewith. For fitting the covering cap 16 to the elastomer member 14, fixing pins 17 formed inside the covering cap 16 are inserted into pin holes 18 formed in the elastomer member 14, and that part of each fixing pin 17 which is protruding from the pin hole 18 is thermally deformed to give a fixing part 19. Thus, the covering cap 16 is fixed and united to the elastomer member 14.

Formed between the fitting surfaces of the elastomer member 14 and the covering cap 16 is a vent passageway 20, which is open to the outside at the edge of the covering cap 16. This air passageway 20 is separated by the water-repellent film 11 from the air passageway 13 formed inside the elastomer member 14.

Figure 2A:
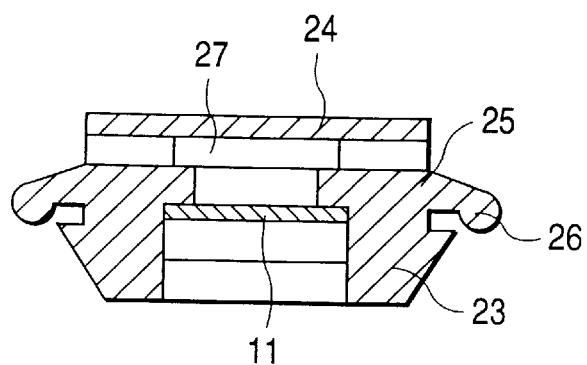
FIG. 2 (A) is a vertical sectional front view illustrating a second embodiment of the vent filter member according to the present invention.
Figure 2B:
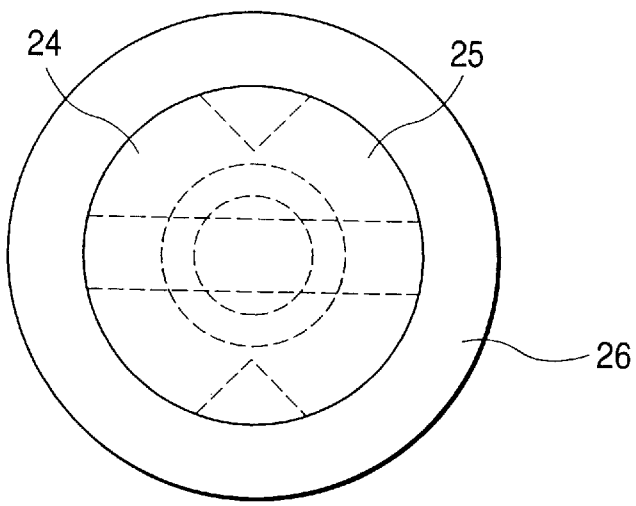
Figure 2C:
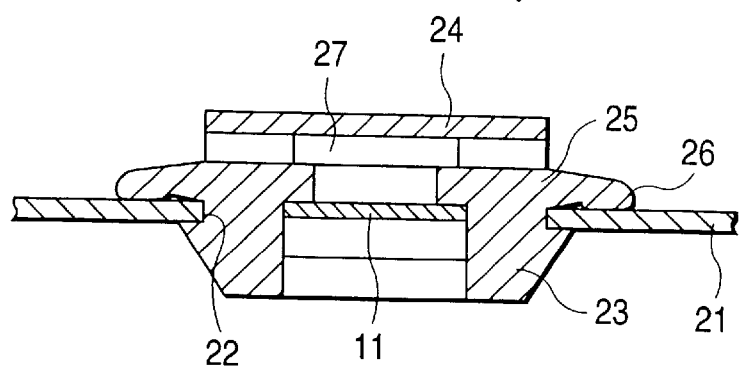
Figure 3A:
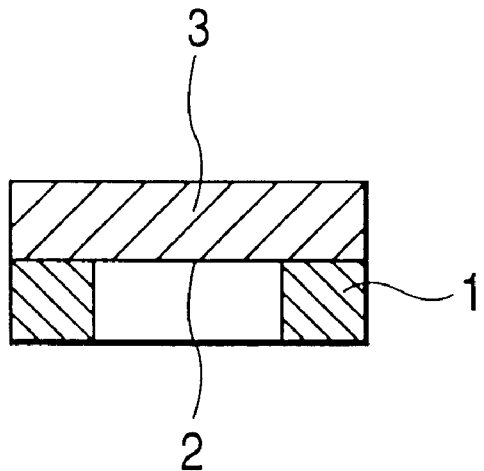
FIG. 3 (A) is a vertical sectional front view illustrating a conventional vent filter member.
Figure 3B:
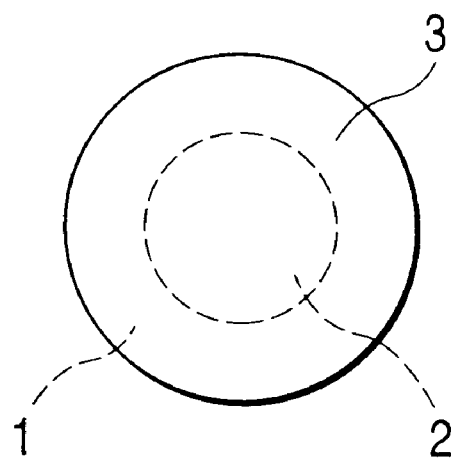
Figure 4:
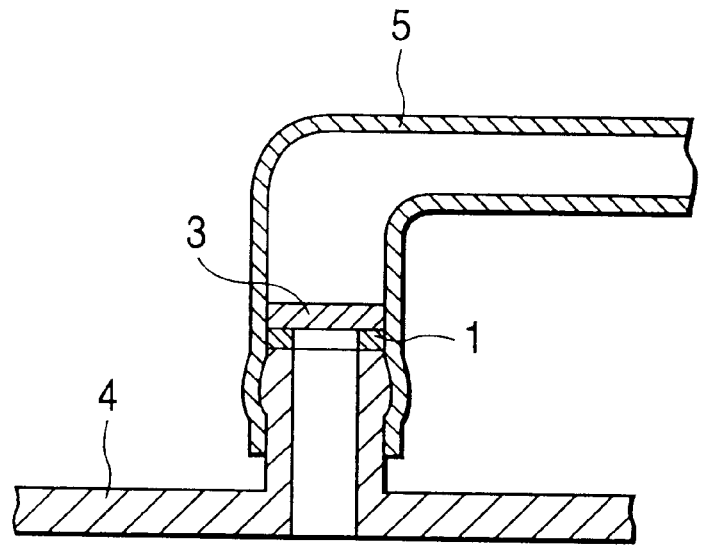
FIG. 4 is a vertical sectional view illustrating the conventional vent filter member mounted on a base.
Figure 5:
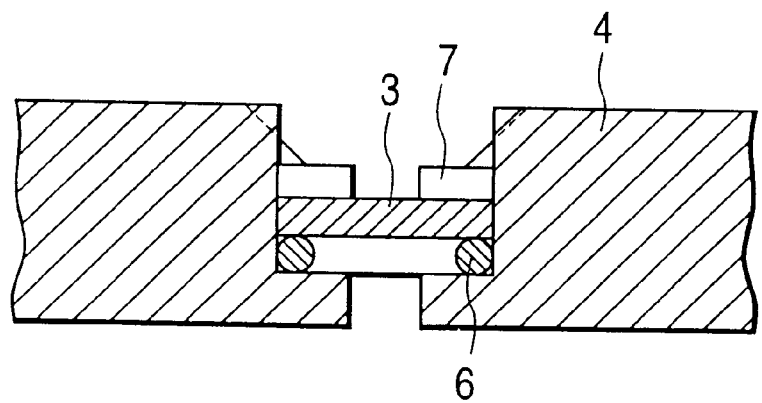
FIG. 5 is a vertical sectional view illustrating the conventional vent filter member mounted on another type of base.

The second embodiment, which is illustrated in FIG. 2, is a vent filter member to be applied to a base in which the mounting part is a hole formed in a flat plane. This vent filter member comprises a water-repellent film 11 and an elastomer member 25, which is made of a thermoplastic elastomer having rubber elasticity to which the water-repellent film 11 can be fixed by fusion. The elastomer member 25 has a disk form. It has on one side thereof a tapered insertional part 23 to be inserted into a mounting part 22 of a base 21, and is blocked on the other side with a mist barrier cover 24. This elastomer member 25 has on its outer periphery a sealing/fixing part 26, which tightly holds the base 21 in cooperation with the insertional part 23.

The elastomer member 25 has a vent passageway 27 extending from one side thereof to the outer periphery of the other side. The water-repellent film 11 has been fixed by thermal fusion to the elastomer member 25 somewhere in the vent passageway 27 to block the passageway 27 therewith.

The vent filter members described above as the first and second embodiments each can be easily mounted on a base by merely press-fitting the opening 12 or the tapered insertional part 23. The vent filter members thus mounted are less apt to suffer a decrease in breathing function caused by the fouling of the water-repellent film 11 because of watertightness. The filter members are hence highly reliable.

In the first and second embodiments, any water-repellent film may be used as the water-repellent film 11 without particular limitations, as long as it has air permeability and shows waterproofness in a degree suitable for a particular application. In general, the larger the pore diameter, the better the air permeability, while the smaller the pore diameter, the better the waterproofness. It is therefore possible to provide a vent filter member having satisfactory breathing sensitivity by employing a water-repellent film 11 which has the largest pore diameter necessary for maintaining the desired waterproofness and increasing an effective air permeation area per vent filter member so as to obtain sufficient air permeability.

For applications in which the waterproofness required is on such a level as to prevent a water mist from coming into the apparatuses, use may be made of a woven fabric, nonwoven fabric, or net each made of a fibrous material, either natural or synthetic, or of a porous material formed by powder sintering or an expanded material each having a pore diameter of 10 $\mu$m or larger. When such films are hydrophobic, they can be used without any treatment. When the films are hydrophilic, they can be coated with a water-and-oil repellent such as a fluorochemical or a silicone before use. A laminate of these can also be used. For applications in which a high degree of waterproofness is necessary, a microporous film having a pore diameter of 10 $\mu$m or smaller produced by the stretching or extraction process can be used. If necessary, the microporous film may be coated with the water-and-oil repellent mentioned above. Especially preferred microporous films are stretched porous polytetrafluoroethylene membranes and various laminates thereof, because the constituent polymer per se has the water repellency, heat resistance, and chemical resistance. These films and laminates preferably have a pore diameter of from 0.01 to 10 $\mu$m.

The reasons for the use of a thermoplastic elastomer include the following: (1) any desired shape can be produced at low cost by injection molding; (2) high reliability is attainable in the thermal fusion-fixing of the water-repellent film 11; and (3) in mounting on a base, watertightness can be realized through a simple operation such as press fitting.

From the standpoint of the thermal fusion fixing of the water-repellent film 11, the elastomer is not particularly limited in composition, and may have any composition as long as the water-repellent film can be fixed by the thermal fusion of the elastomer. Examples of the elastomer include polystyrene, polyolefin, poly(vinyl chloride), polyester, polyurethane, polyamide, and fluorochemical elastomers. Heat resistance, weatherability, chemical resistance, and other properties are taken in account when selecting an elastomer suitable for the environment in which the vent filter member is to be used.

In order for the elastomer to be easily mounted and attain watertightness, it desirably has a compression set of 70% or lower, preferably 50% or lower, under the conditions of 70° C. and 22 hours (JIS K 6301) and a hardness as measured with an A type hardness tester of 100 or lower, preferably 80 or lower at 25° C. If the compression set thereof is higher than 70%, a gap is formed after mounting between the housing and the elastomer due to vibration and a difference in thermal expansion coefficient between the materials, resulting in reduced watertightness. If the hardness of the elastomer exceeds 100, mounting on a base necessitates a large force.

The present invention will be explained below in more detail by reference to the following Example, but the invention should not be construed as being limited thereto.

EXAMPLE

Styrene elastomer "Leostomer LJ-1070N", manufactured by Riken Vinyl Industry Co., Ltd., Japan (compression set, 37%; hardness, 62), was used as a thermoplastic elastomer having rubber elasticity to obtain an injection-molded elastomer member having the structure shown in FIG. 1. "Microtex NTF1026-C02" manufactured by Nitto Denko Corporation (a laminate comprising a porous PTFE membrane having a thickness of 25 μm and a nominal pore diameter of 0.6 μm and a woven polyester fabric bonded to the membrane with an acrylic rubber adhesive applied partially) was used as a water-repellent film. This film was placed on the elastomer member in such a manner that the PTFE membrane side was in contact with the elastomer. A pipe having an inner diameter of 7 mm and an outer diameter of 12 mm was heated to 200° C. from the woven polyester fabric side of the water-repellent film, and pressed for 5 seconds at a load of 300 g to thereby fusion-bond the film.

A hydraulic pressure of 1.0 kg/cm$^2$ was applied to the elastomer member from the opening to ascertain that no water leaked from the fusion-bonded part.

Polycarbonate "Lupilon S2000R", manufactured by Mitsubishi Engineering Plastics Corp., Japan, was used to obtain an injection-molded covering cap having the structure shown in FIG. 1. The fixing pins of this covering cap were inserted into the elastomer member having the water-repellent film fusion-bonded thereto to thereby fit the covering cap to the elastomer member. Thereafter, the tip of each fixing pin was deformed by pressing a 250° C. hot plate against the same to firmly fix the covering cap. Thus, a vent filter member was fabricated.

As described above, the present invention can provide a vent filter member which can be easily mounted on a base, is less apt to suffer a decrease in breathing function caused by watertightness or by water-repellent-film fouling, and is hence highly reliable.

While the invention has been described in detail and with reference to specific embodiments thereof, it will be apparent to one skilled in the art that various changes and modifications can be made therein without departing from the spirit and scope thereof.

What is claimed is:

1. A vent filter member which comprises: an elastomer member made of a thermoplastic elastomer having a cylindrical form whose one end part serves as an opening for insertion of a projecting part of a base; a water-repellent film thermally fusion-bonded to the other end part of the elastomer member; and a covering cap which protects the water-repellent film and has been fitted and fixed to the elastomer member in such a manner that a vent passageway is formed between the elastomer member and the covering cap.

2. The vent filter member of claim 1, wherein the water-repellent film is composed of a stretched porous polytetrafluoroethylene membrane.

3. The vent filter member of claim 1, wherein the thermoplastic elastomer has a compression set of 70% or lower under the conditions of 70° C. and 22 hours according to JIS K 6301.

4. A vent filter member which comprises: an elastomer member made of a thermoplastic elastomer having a disk form which has on one side thereof a tapered insertional part to be inserted into a mounting part, is blocked on the other side with a mist barrier cover, and has a sealing/fixing part on the outer periphery thereof and a vent passageway extending from said one side to the outer periphery of said other side; and a water-repellent film fixed by fusion to the elastomer member at any point in the vent passageway so as to block the vent passageway therewith.

5. The vent filter member of claim 4, wherein the water-repellent film is composed of a stretched porous polytetrafluoroethylene membrane.

6. The vent filter member of claim 4, wherein the thermoplastic elastomer has a compression set of 70% or lower under the conditions of 70° C. and 22 hours according to JIS K 6301.

* * * * *